United States Patent [19]

Ozmat et al.

[11] Patent Number: 5,754,403

[45] Date of Patent: May 19, 1998

[54] CONSTRAINING CORE FOR SURFACE MOUNT TECHNOLOGY

[75] Inventors: Burhan Ozmat, Dallas; Robert Kent Peterson, Garland; Aubrey Chapman, Richardson, all of Tex.

[73] Assignee: Texas Instruments Incorporated, Dallas, Tex.

[21] Appl. No.: 336,705

[22] Filed: Nov. 8, 1994

Related U.S. Application Data

[63] Continuation of Ser. No. 702,348, May 15, 1991, abandoned, which is a continuation of Ser. No. 415,011, Sep. 29, 1989, abandoned.

[51] Int. Cl.⁶ .................................................. H05H 7/20
[52] U.S. Cl. .................. 361/720; 174/252; 428/137; 428/209; 428/901; 428/95
[58] Field of Search .................. 165/80.3, 185; 174/252; 75/5 R; 501/96; 361/704–710, 712, 713, 719–721; 428/137, 209, 210, 566, 627, 650–651, 666–661, 663, 684, 698, 699, 901; 29/852

[56] References Cited

U.S. PATENT DOCUMENTS

| | | | |
|---|---|---|---|
| 3,061,760 | 10/1962 | Ezzo | 361/389 |
| 3,165,672 | 1/1965 | Gellert | 361/387 |
| 3,213,184 | 10/1965 | Bondley | 174/50.58 |
| 3,334,395 | 8/1967 | Cook et al. | 29/852 |
| 3,793,570 | 2/1974 | Crouch et al. | 257/687 |
| 3,984,209 | 10/1976 | Hickey | 428/566 |
| 4,347,076 | 8/1982 | Ray et al. | 75/0.5 R |
| 4,647,546 | 3/1987 | Hall, Jr. et al. | 501/96 |
| 4,695,517 | 9/1987 | Okuno et al. | 428/699 |
| 4,700,273 | 10/1987 | Kaufman | 361/388 |
| 4,739,443 | 4/1988 | Singhdeo | 361/385 |
| 4,745,455 | 5/1988 | Glascock, II et al. | 357/74 |
| 4,788,166 | 11/1988 | Araki et al. | 501/96 |
| 4,882,454 | 11/1989 | Peterson et al. | 361/414 |
| 4,882,654 | 11/1989 | Peterson et al. | 361/704 |
| 4,890,195 | 12/1989 | Heckaman et al. | 361/388 |
| 4,894,271 | 1/1990 | Hani et al. | 428/137 |
| 4,963,414 | 10/1990 | LeVasseur et al. | 174/252 |
| 5,195,021 | 3/1993 | Ozmat et al. | 174/252 |

FOREIGN PATENT DOCUMENTS

| | | | |
|---|---|---|---|
| 1105068 | 3/1968 | United Kingdom | 174/252 |

OTHER PUBLICATIONS

CRC "Materials Science and Engineering" Haueback, Second Edition, pp. 269–273, 1996.

*Primary Examiner*—Gregory D. Thompson
*Attorney, Agent, or Firm*—Richard L. Donaldson; René E. Grossman

[57] ABSTRACT

A thermal core (10) including aluminum layer (12) held between two molybdenum layers (14) for dissipating heat from a plurality of chip carriers (22). Core (10) has the ability to withstand excessive vibrational loads while being lightweight. Bonding molybdenum/aluminum/molybdenum layers (12, 14) creates a core (10) having an increased stiffness factor which surpasses military vibrational requirements. Additionally, due to the low density of porous aluminum layer (12), weight limitations set forth by the military can also be met.

29 Claims, 1 Drawing Sheet

CONSTRAINING CORE FOR SURFACE MOUNT TECHNOLOGY

This application is a continuation of application Ser. No. 07/702,348 filed May 15, 1991, which is a continuation of application Ser. No. 07/415,011 filed Sep. 29, 1989, which are now abandoned.

TECHNICAL FIELD OF THE INVENTION

This invention relates in general to a constraining core for surface mount technology used for bonding printed wiring boards (PWBs), and in particular to a layered, low density composite constraining core which functions to dissipate heat from electronic components mounted on PWBs and which has a tailored coefficient of thermal expansion (CTE) for improving the thermal fatigue life of solder joints which form the electrical and mechanical contacts between ceramic chip carriers (CCC) and PWBs.

BACKGROUND OF THE INVENTION

High density electronic systems, such as types developed for aerospace and military applications, can be formed of two-sided electronic circuit modules typically having twenty-five (25) or more square inches of printed wiring board space on each side. These circuit modules must have a combination of mechanical and thermal properties which enable the system to tolerate environmental stress due to temperature excursions and vibration without structural failures. Differences in material properties among the various components in prior circuit modules can lead to failures during normal operation.

In recent years, the military has been increasing its vibrational loading standards and lowering the weight requirements for electronic circuit modules. Unfortunately, to withstand environmental stresses and to dissipate power, the conventional surface mounts for printed wiring boards (PWBs) have been utilizing heavy copper layered composite materials. To meet military weight requirements, these composite materials have been thinned. Because of the stringent weight requirements imposed on military avionics, these materials are thinned down, and therefore, could not protect the components of surface mount modules under high vibrational stress conditions and could not provide constraining at adequate levels to prevent premature thermal fatigue failures of the solder joints of leadless ceramic packages.

The conventional surface mount technology of a circuit board uses clad materials for the core, such as copper-invar-copper (CIC) or copper-molybdenum-copper (CMC), as the constraining heat sink for high power devices. Currently available CIC and CMC layered materials have relatively high densities which requires the fabrication of thin layers of these materials to meet the weight requirements set by the military. Unfortunately, this thinning of the layers occurs at the expense of reduced stiffness of the surface mount module which lowers resonant vibration frequency. Because of the reduced thickness of the copper, there is minimal dissipation of heat from the surface mounted electronic components.

When the thickness of the core is reduced to meet the weight requirements, the thickness ratio of the copper layers is increased to make up for the reduced cooling capacity. This increased copper thickness ratio in the CIC and CMC layers tends to cause the core to have relatively high CTE. Unfortunately, a high CTE results in extremely high stress and strain which ultimately causes fracturing of solder joints of CCCs and similar electronic components. These fractures obviously lead to system failures at total separation. The thermal stress can be reduced if the coefficient of thermal expansion (CTE) of the core is lowered to a range close to that of the ceramic chip carrier required by the military.

To compensate for the reduced thickness of CIC and CMC layers, the stiffness and therefore the vibration resistance has been increased by incorporating structural stiffeners, such as ribs, to increase the structural rigidity of the module without dramatically increasing the core weight. However, the stiffeners require space on the module for attachment by screws which results in less space for the electronic device placement. The stiffeners also have the following disadvantages: increased module fabrication time, added weight associated with the stiffeners, added system costs associated with the fabrication of the stiffeners and routing problems in the design of PWBs particularly associated with rib type stiffeners.

A need has therefore arisen for a lightweight surface mount composite core for printed circuit boards which has a high thermal conductivity and therefore a high conduction cooling capacity associated with the composite core layers. Additionally, to eliminate the CTE mismatch which results in cracking of the solder joints between the electronic components and the PWBs of the surface mount modules a composite core that has a CTE which is approximately the same as that of the electronic components is needed. Finally, there is a need for a lightweight core for bonding PWBs which has a high stiffness in order to meet the ever increasing vibration requirements set by the military.

SUMMARY OF THE INVENTION

An important aspect of the present invention comprises a composite core material for mounting printed wire boards (PWBs) thereto. Specifically, the present invention comprises a molybdenum coated aluminum layer for creating a lightweight core to function as a heat sink for surface mounted printed wiring boards. The present invention generally comprises a thermal core having an aluminum layer embedded between two layers of molybdenum. Initially, the aluminum layer, having a thickness of approximately 0.080 inches, and a purity of approximately 0.010 to 0.250 inches and preferably 99.99%, is bonded to two layers of molybdenum coated with a thin layer of aluminum. These coated layers of molybdenum are created by forming an aluminum coating onto the molybdenum layer by ion vapor deposition. In its preferred embodiment, the molybdenum has a thickness of approximately 0.020 inches and a purity of approximately 0.005 to 0.030 inches and preferably 99.96%. The bond between the molybdenum layer and the aluminum layer is created by brazing them together with a thin layer of aluminum silicon alloy. This brazing process involves placing a thin layer of aluminum silicon alloy between the aluminum coated molybdenum layers and the aluminum layer and heating them until the layers bond together. These layers comprise the thermal core necessary for dissipating the heat from the chip carriers mounted to the printed wiring board.

Once the thermal core has been fabricated, the printed wiring boards are typically attached to the thermal core by use of an epoxy glass layers. Subsequently, the chip carrier, made of a ceramic aluminum oxide, is bonded to the printed wiring board by use of a solder joint in a reflow cycle. It can be appreciated that the delicate solder joints establish the mechanical and the electrical conductivity between the leadless ceramic chip carriers (LCCCs) and the PWBs which are also bonded to the thermal core by laminating and curing with an epoxy-glass laminate under temperature and pressure conditions.

In its preferred embodiment, the PWBs are attached to both sides of the thermal core to create a symmetrical double-sided module. This symmetrical construction eliminates any unwanted warping associated with the board during temperature excursions. As part of the invention, a plurality of leadless chip carriers can be attached to the PWBs bonded on both sides of the thermal core to increase the packaging density.

The present invention is capable of rapidly withdrawing heat from the chip carrier to function as a heat sink for the system. Additionally, the present invention is capable of reducing thermal stresses and strains in the solder joints. This is because of the fact that the thermal expansion (CTE) of the chip carrier and the thermal core are approximately the same and no greater than approximately 7 ppm/°C. Additionally, the stiffness associated with the thermal core provides sufficient resistance to the board to withstand high vibration levels without assuming large deflections and thereby to protect and improve the reliability of solder joints.

The present invention presents technical advantages over the conventional composite cores. These advantages are because of its ability to expand and contract with temperature excursions at a rate compatible with that of leadless ceramic chip carriers (i.e., approximately −55 degrees C. to approximately 125 degrees C.), its ability to efficiently transfer heat from the chip carrier, and its ability to withstand high vibrational stresses while maintaining a relatively low weight. The substrate has a tailorable coefficient of thermal expansion with low end value of approximately 6.5 ppm/°C. and which can be tailored by proper selection of the molybdenum and aluminum thicknesses.

BRIEF DESCRIPTION OF THE DRAWINGS

Other aspects of the present invention and their advantages will be discerned after studying the Detailed Description in connection with the Drawings in which.

DETAILED DESCRIPTION OF THE INVENTION

Figure 1:
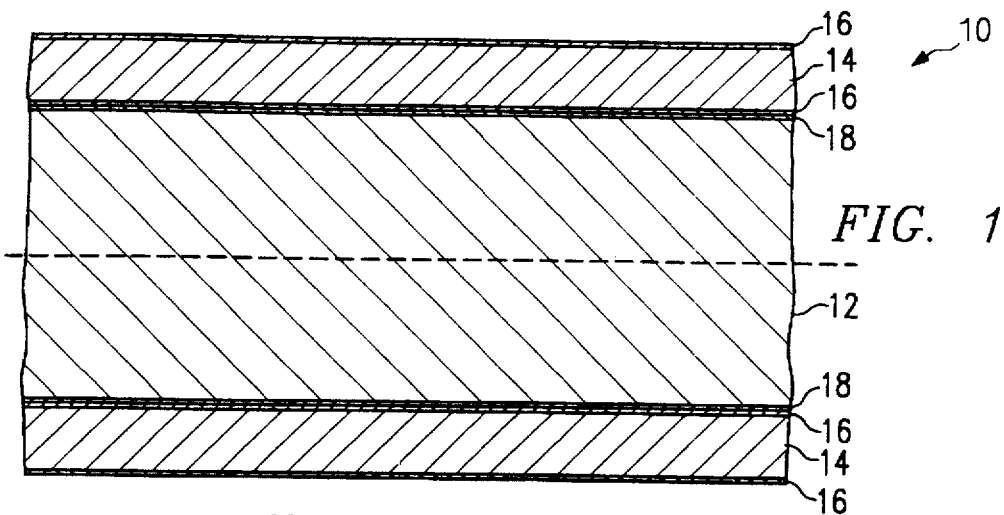
FIG. 1 is an enlarged cross-sectional view of a thermal core according to the present invention.

Referring to FIG. 1, a thermal core of an integrated circuit board is shown in an enlarged cross-sectional view and is generally designated 10. Core 10 generally comprises an aluminum layer 12 held between two molybdenum layers 14. Two layers of aluminum silicon alloy filler 18 are positioned between layers 14 and layer 12 to bond layers 14 and 12 together to form core 10. Additionally, molybdenum layers 14 can be coated with a thin layer of aluminum 16 by ion vapor deposition.

The present invention discloses core 10 which is capable of offering a high performance heat sink material for surface mount electronic modules. Core 10 offers a material which has a low density, high thermal conductivity, and high specific stiffness, while providing the module coefficient of thermal expansion (CTE) control necessary for reliable use with ceramic chip carriers.

Figure 2:
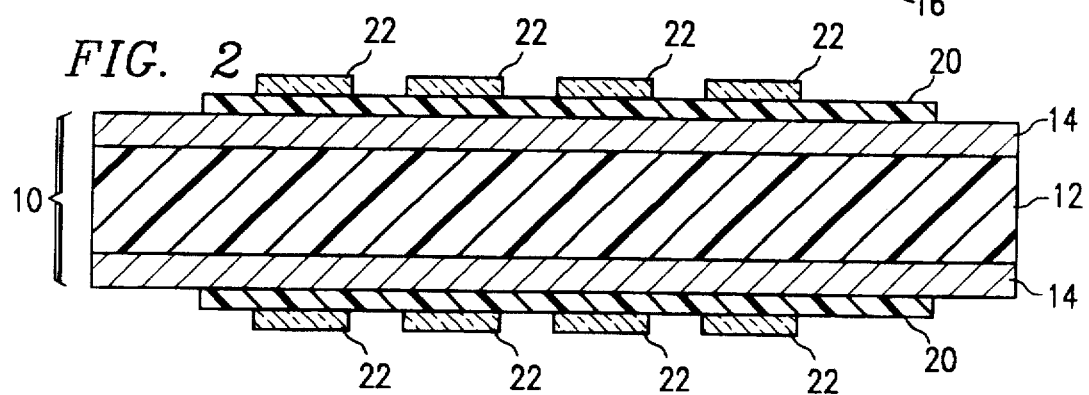
FIG. 2 is an enlarged cross-sectional view of the thermal core connected to a plurality of leadless ceramic chip carriers, hybrid packages, capacitors and resistors in accordance with the present invention.

Referring now to FIG. 2, the preferred embodiment of the present invention can be seen. As can be appreciated, FIG. 2 illustrates the ability to have a plurality of chip carriers 22 connected to a printed wiring board 20. This double-sided symmetrical construction allows for the reduction of warping by having a mirror image of the PWBs and chip carriers 22 interconnected in such a manner. When the chip carriers 22 and other electronic packages and components are powered, heat will transfer through PWB 20 to thermal core 10. Heat dissipation from chip carriers 22 is a function of the thermal conductivity of core 10. Consequently, the higher the thermal conductivity or lower the thermal resistance of core 10, the faster heat will dissipate from chip carriers 22 in PWB 20 through a minimal temperature gradient which is due to core 10.

In operation, thermal core 10 acts as a sufficient heat sink to dissipate heat generated by active electronic devices which are held within chip carriers 22. Additionally, core 10 acts as a substrate for which board 20 and leadless ceramic chips 22 are attached. Due to the particular stacking order of aluminum layer 12 and molybdenum layers 14, there is an increased stiffness which results in a higher resistance to the vibrational loading by reducing bending displacement of core 10 under vibration loads. Consequently, military standards which have been increased through the years are able to be met because of the increased vibrational loading abilities of the novel thermal core 10. Accordingly, there is an increased bending stiffness of the electronic modules which have been increased due to the special stacking order of layers 12 and 14.

The coefficient of thermal expansion (CTE) becomes important when designing thermal core 10 of the present invention. The CTE of core 10 needs to match the CTE of chip carrier 22 in order to reduce the amount of relative thermal displacement between chip carrier 22 and thermal core 10 during temperature excursions. The average CTE for aluminum and molybdenum are 23.4 and 5.2 parts per million per degrees Centigrade (ppm/°C.), respectively. In the past, it has been necessary to use a high thickness ratio to adequately constrain the aluminum due to its high coefficient of thermal expansion and relatively high modules of elasticity (10.7 MSI).

To overcome the difficulties associated with aluminum's high CTE, it has been found that if pure, porous or pure and porous aluminum, having a very low initial yield strength and low hardening characteristic is utilized, the expansion of the aluminum held within the molybdenum can be controlled with much lower molybdenum to aluminum ratios.

In experimentation, it has been found when using a porous aluminum layer 12, having approximately 70% of its theoretical density, and having a 99.99% purity, resulted in the desired properties for the composite core 10. It has been found that the average CTE of the present invention, when utilizing the pure and porous aluminum layer 12, has an average CTE of approximately six (6) ppm/°C. Additionally, the vibrational frequency has been modeled and calculated to be 760 hertz for a typical size assembly using a 0.100 inch thick thermal core. The resultant effective thermal conductivity is approximately 140 W/M/°C. This results in an ideal material which can also readily dissipate heat from the overlying chip carriers 22.

In experimentation, it has been found that if molybdenum layers 14 have an aluminum coating 16 of adequate thickness deposited thereon, the bonding between molybdenum layers 14 and aluminum layer 12 is greatly facilitated. The specific stiffness of this structure is maximized when high modulus layers are placed over the soft and porous aluminum plate. This particular feature of the present invention proves very beneficial when utilizing a particular embodiment for applications within the field of aerospace and avionics such as skin material for space stations, mirrors, etc.

In its final form for a typical size SMT module, core 10 comprises a molybdenum layer 14 thickness of approximately 0.020 inch total. Additionally, the optimum thickness of filler 18 has been found to be approximately in the 0.005 inch to 0.010 inch range. Additionally, the typical finished thickness of this particular embodiment is approximately 0.100 inch and its size is about six inches by six inches. The desired purity of the aluminum is approximately 99.99% and the desired density of aluminum is approximately 70% of its theoredial density. The properties of core 10 have been calculated and measured to be:

Thermal conductivity (calculated): 140 W/M/°C.

First natural frequency of a SEM/E size module (calculated): 760 Hz.

The average CTE (measured & calculated): 6 ppm/°C.

FABRICATION

Figure 3:
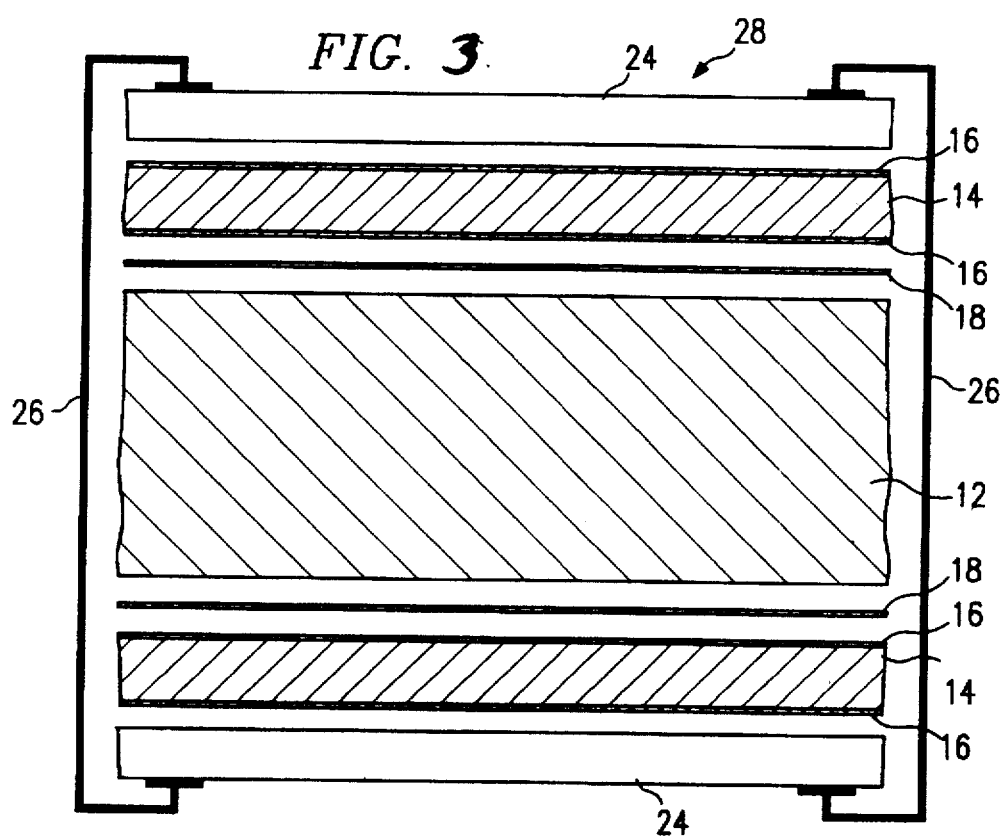
FIG. 3 is an exploded cross-sectional view of the thermal core illustrating the method of bonding the layer together as disclosed in the present invention.

Referring now to FIG. 3, the fabrication of the present invention can be seen. Generally, the process comprises a molten salt bath brazing of molybdenum layers 14 to aluminum layer 12. Initially, molybdenum layers 14 are coated with an aluminum material by aluminum ion vapor deposition methods well known in the art. This coating is preferably between approximately 0.002 inch and approximately 0.004 inch thick. If a porous powder metal aluminum layer is utilized, however, it must be processed in order to smooth the brazing surfaces to such an extent to seal the majority of the surface porosity. This is conducted by grinding the exterior surfaces with an abrasive paper. The substrate is then ultrasonically rinsed in hot water prior to the brazing process.

After the aluminum coating 16 has been deposited to molybdenum layers 14, molybdenum layers 14 and aluminum layer 12 are preferably handled with lint-free gloves to avoid contamination. It is preferable that all pieces be kept flat to assure that a brazing gap of 0.002 to 0.004 inch during the brazing operation be maintained. Aluminum layer 12 is then held between two layers of aluminum alloy BAlSi-4 (as designated by the American Welding Society) having a thickness between approximately 0.005 and 0.010 inches to function as the brazing shim. Subsequently, layers 14 which have been coated with aluminum coating 16 are then placed across the top and bottom sides of pure and porous aluminum layer 12 having filler metal sheets 18 held therebetween.

Next, a type 304, or equivalent, stainless steel clamping plate 24 is placed across the exposed surfaces of layers 14. After clamping plates 24 have been placed in their proper location, a plurality of Inconel clips 24 are then fastened around the exterior to hold assembly 28 in position. After assembly 28 is placed on a type 304 stainless steel tray in a horizontal position, assembly 28 is then preheated at 1000 plus or minus 25 degrees Fahrenheit for not less than 15 minutes.

After assembly 28 has been preheated, the holding tray is then dipped into a molten salt bath composed of Park Chemical Company ABS-E brazing salt balanced at a minimum of 22% LiCl and using NaF in the 4% and 6% concentration range. The bath temperature is maintained at approximately 1100° plus or minus 5° Fahrenheit for approximately 30 to 40 seconds. After this process, the tray is slowly removed and cooled at a rate of not greater than 100 degrees Fahrenheit per hour until cooled to room temperature.

Assembly 28 is then soaked in boiling water for not less than 20 minutes to remove the majority of the molten salt residue. After the residue has been removed, brazed assembly 28 is ultrasonicly rinsed in hot water between approximately 185 and 212 degrees Fahrenheit.

An alternative process may be utilized which can avoid the risk of chloride entrapment by using vacuum brazing technique. In its arrangement, the pieces of assembly 28 are processed identical to the molten salt bath sequence, but instead an Aluminum Association number 8 clad brazing sheet is used instead of the alloy BAlSi-4 shim to provide the filler material. This No. 8 sheet consists of an alloy 3003 or 3004 brazing filler material to 7½% of the nominal thickness. This clad brazing sheet can be used in a very thin gauge for the purpose of providing filler material. Assembly 28 is placed in the furnace containing a boat of magnesium powder. The furnace is then evacuated to approximately 100 militorr pressure and heated to approximately 1100 degrees Fahrenheit. The magnesium acts as a getter for the oxides and the low oxygen pressure prevents their reforming which enhances the bonding kinetics. After the workpiece has been held at a temperature of 1100 degrees Fahrenheit for a period of 30 to 60 seconds, as measured by a load thermacouple, the furnace is backfilled and cooled with an inert gas, such as nitrogen. Additionally, in the alternative embodiment, a post braze cleaning is not required.

Yet another process to fabricate the molybdenum-aluminum-molybdenum composite core 10 is diffusion bonding which does not require any filler material. In the diffusion bonding process, ion vapor deposition aluminum coated molybdenum sheets are placed above and below a compacted pure aluminum powder preform having a 70 percent theoretical density. The whole assembly is then placed in a vacuum chamber and heated to approximately 1100° F. As the compacted alumumium powder sinters to a monolithic body of a porous Al sheet, bonding between aluminium coated molybdenum sheets and porous pure aluminum core takes place simultaneously. In this vacuum diffusion bonding process, using an oxygen getter such as magnesium powder will improve the bonding quality.

The present invention is applicable for several technologies, such as space and avionics. The heat sink core 10 may be utilized for other means, and is not necessarily used as a heat sink device. This could be used for the outer core of an automobile or an aircraft due to its lightweight and structural stability.

In summary, an advantageous, lightweight, controllable, thermal expansion, coefficient material, having a high heat transfer coefficient has been disclosed which features the use of a pure and porous aluminum layer embodied between two high modulus molybdenum skin layers to improve its stiffness. It has been found that due to its high stiffness, low weight, low cost, and high constraining effect, the new composite material has good potential for use in airborne and space applications.

While preferred embodiments of the invention and their advantages have been disclosed in the above detailed description, the invention is not limited thereto, but only by the spirit and scope of the appended Claims.

What is claimed is:

1. A composite core for mounting of electrical components thereon comprising:
    (a) a layer of elemental aluminum having a pair of opposing surfaces; and
    (b) a material displaying high thermal conductivity and having a high modulus relative to said layer of elemental aluminum and low coefficient of thermal expansion relative to said layer of elemental aluminum bonded to each of said opposing surfaces of said layer of elemental aluminum.

2. The core as recited in claim 1, wherein said material displaying high thermal conductivity are individual layers of molybdenum one layer of molybdenum bonded to each of said opposing surfaces.

3. The core as recited in claim 1, further comprising an aluminum/silicon alloy filler disposed between said layer of elemental aluminum and said material displaying high thermal conductivity bonding said layer of elemental aluminum and said material displaying high thermal conductivity together.

4. The core as recited in claim 2, wherein each said layer of molybdenum includes a thin elemental aluminum coating disposed thereon on the side thereof more closely adjacent said layer of elemental aluminum.

5. The core as recited in claim 1, wherein said layer of elemental aluminum is porous and has a density of approximately 70% of the theoretical density of elemental aluminum.

6. The core as recited in claim 1, wherein said material displaying high thermal conductivity has an exposed surface on each opposing side of said layer of elemental aluminum, further comprising a printed wiring board coupled to at least one of said exposed surfaces.

7. The core as recited in claim 6, further comprising a chip carrier and a bonding material bonding said chip carrier to said printed wiring board.

8. The core as recited in claim 7, wherein said bonding material between said chip carrier and said printed wiring board is a solder joint.

9. The core as recited in claim 2, wherein each said layer of molybdenum has a thickness of about 0.020 inches.

10. The core as recited in claim 1, wherein said layer of aluminum has a thickness of about 0.080 inches.

11. The core as recited in claim 3, wherein said filler has a thickness between about 0.050 inches and about 0.010 inches.

12. An electronic system, comprising:
 (a) a substrate having a core portion formed of elemental aluminum, said core having first and second opposing surfaces, each said surface clad with one of a first and second metallic layer, each said metallic layer having a high modulus and low coefficient of thermal expansion relative to said core of elemental aluminum and of predetermined thickness;
 (b) at least one printed wiring board bonded to a said substrate surface; and
 (c) at least one integrated circuit carrier secured to said printed wiring board, the combination of said substrate and said printed wiring board bonded thereto providing an effective coefficient of thermal expansion to each said printed wiring board which is sufficiently close to the coefficient of thermal expansion of said circuit carrier to prevent premature cracking between said circuit carrier and said printed wiring board during the operation of the system under expected temperature excursions thereof.

13. The system as recited in claim 12, wherein the effective coefficient of thermal expansion of each bonded printed wiring board is sufficiently close to that of the circuit carrier to prevent cracking between said circuit carrier and said printed wiring board during thermal cycling of the system from about −55 degrees Centigrade to about 125 degrees Centigrade.

14. The system as recited in claim 12, wherein said each of said first and second metallic layers comprises a molybdenum layer having a separate elemental aluminum layer deposited thereon intermediate said elemental aluminum and said molybdenum layer.

15. The system as recited in claim 12, wherein said elemental aluminum portion of said substrate is from about 0.010 inch to about 0.250 inch thick and each metallic layer has a thickness from about 0.005 inch to about 0.030 inch, said substrate having a coefficient of thermal expansion no greater than about 7 ppm/°C.

16. The system as recited in claim 12, wherein said substrate has a tailorable coefficient of thermal expansion with low end value of about 6.5 ppm/°C. by predetermined selection of the molybdenum and elemental aluminum thicknesses.

17. The system as recited in claim 14, wherein said aluminum is porous aluminum having a density of about 70% of the theoretical density of elemental aluminum.

18. An electronic system, comprising:
 (a) a layer of elemental aluminum having opposing surfaces;
 (b) two molybdenum layers, each of said molybdenum layer bonded to a different one of said opposing surfaces of said layer of elemental aluminum to provide a thermal core, each said molybdenum layer having a surface;
 (c) a printed wiring board coupled to a said surface of at least one of said molybdenum layer surfaces; and
 (d) a plurality of chip carriers, each said chip carrier having a multiplicity of solder joints, said solder joints bonded to said printed wiring board for connecting each said chip carrier to said printed wiring board.

19. The system as recited in claim 18, wherein each said chip carrier and said thermal core have substantially the same coefficient of thermal expansion.

20. The system as recited in claim 18, wherein said thermal core functions as a heat sink for said the printed wiring board, said thermal core readily transferring heat from said printed wiring board and said chip carriers to said thermal core.

21. The system as recited in claim 18, wherein said aluminum is porous aluminum having a density of about 70% of the theoretical density of elemental aluminum.

22. A process for manufacturing a composite core comprising the steps of:
 (a) applying to each of opposing surfaces of a layer of elemental aluminum a layer of aluminum/silicon alloy filler;
 (b) applying a layer of molybdenum to each said layer of aluminum/silicon alloy filler; and
 (c) heating each of said layers of elemental aluminum, molybdenum and filler until said aluminum/silicon alloy filler melts to bond said layer of aluminum to said molybdenum layers.

23. The process as recited in claim 22, further including brazing together said layers of elemental aluminum and molybdenum by the step of heating.

24. The process as recited in claim 22, wherein said heating step comprises heating said layer to about 1100° Fahrenheit.

25. The process as recited in claim 22, wherein said aluminum is porous aluminum having a density of about 70% of the theoretical density of elemental aluminum.

26. A process for manufacturing a composite core comprising the steps of:

(a) providing a high purity substantially elemental aluminum powder preform having surfaces;

(b) providing ion vapor deposition elemental aluminum coated molybdenum sheets having surfaces;

(c) bonding said surfaces of said compacted high purity substantially elemental aluminum powder preform to said surfaces of said ion vapor deposition elemental aluminum coated molybdenum sheets simultaneously as the sintering of said aluminum powders is taking place in a vacuum chamber at about 1100° F.

27. The process as recited in claim 26, further comprising the step of placing an oxygen getter in said vacuum chamber prior to said sintering.

28. The system as recited in claim 26, wherein said aluminum is porous aluminum having a density of about 70% of the theoretical density of elemental aluminum.

29. A composite core for mounting of electrical components thereon comprising:

(a) a layer of substantially elemental porous aluminum having a pair of opposing surfaces and having a density of about 70% of the theoretical density of elemental aluminum; and (b) a material displaying high thermal conductivity and having a high modulus relative to said layer of elemental aluminum and low coefficient of thermal expansion relative to said layer of elemental aluminum bonded to each of said opposing surfaces of said layer of elemental aluminum.

* * * * *